June 25, 1968 H. M. KLEINMAN 3,390,345

TRANSISTOR PROTECTION CIRCUIT

Filed Aug. 31, 1964

INVENTOR.
HENRY M. KLEINMAN
BY
[signature]
ATTORNEY

United States Patent Office 3,390,345
Patented June 25, 1968

3,390,345
TRANSISTOR PROTECTION CIRCUIT

Henry M. Kleinman, Somerville, N.J., assignor to Radio Corporation of America, a corporation of Delaware Filed Aug. 31, 1964, Ser. No. 393,038
6 Claims. (Cl. 330—11)

ABSTRACT OF THE DISCLOSURE

A Class A transistor amplifier including a voltage dependent resistor bypass circuit providing transistor protection against voltage breakdown caused by the large reaction voltage generated in a transformer load when an applied input signal suddenly cuts the transistor off.

This invention relates in general to transistor amplifier circuits and more particularly to transistor audio power amplifier circuits for phonographs, radio receivers and the like.

Presently available line-operated equipment using low voltage transistors require the use of either a power transformer or a voltage dropping resistor having substantial power rating to reduce the line voltage to a safe operating level. The recent introduction of high voltage transistors permits a cost savings by allowing the circuits to be operated at higher voltages and lower currents for a comparable power output thereby eliminating the need for such power transformers or large voltage dropping resistors.

In the design of transistor amplifier circuits it is important that the collector voltage rating of the transistor be maintained within the specified rating. With commercially available high voltage transistors, the collector voltage rating is about 300 volts or about twice the peak voltage derived from a half wave rectifier circuit powered from the alternating current (AC) mains. In the case of an audio power amplifier driving an output transformer, the collector voltage swing under normal operation approaches twice that of the collector supply voltage. However, under transient conditions where the transistor is rapidly cut off, the reaction voltage generated in the transformer winding due to the collapse of the transformer field causes the collector voltage to increase to several times that of the power supply voltage. In accordance with present design techniques, the power supply voltage is reduced to provide sufficient safety factors to prevent the exceeding of the collector voltage rating. Such a design limits the maximum gain and power output from the stage, and in addition defeats the advantages that are obtained from a high voltage low current type power supply.

It is therefore an object of this invention to provide a new and improved low cost protection circuit for inductively loaded transistor circuits.

It is also an object of this invention to provide a new and improved circuit for protecting high voltage transistor audio power amplifier circuits against breakdowns caused by exceeding the collector rating of the transistor by input transients.

It is still a further object of this invention to provide a new and improved circuit for protecting line-operated transformer loaded high voltage transistor audio power amplifier circuits against transient over-voltage collector breakdown.

An audio power amplifier circuit embodying the invention includes a high voltage transistor driving an audio output transformer primary winding. A voltage responsive device having an impedance that is an inverse function of the voltage developed across it is connected across the primary winding and presents a low impedance when the primary winding voltage exceeds a predetermined value, to dissipate the stored energy in the transformer winding and thereby limit the peak voltage excursion at the collector electrode.

Figure 1:
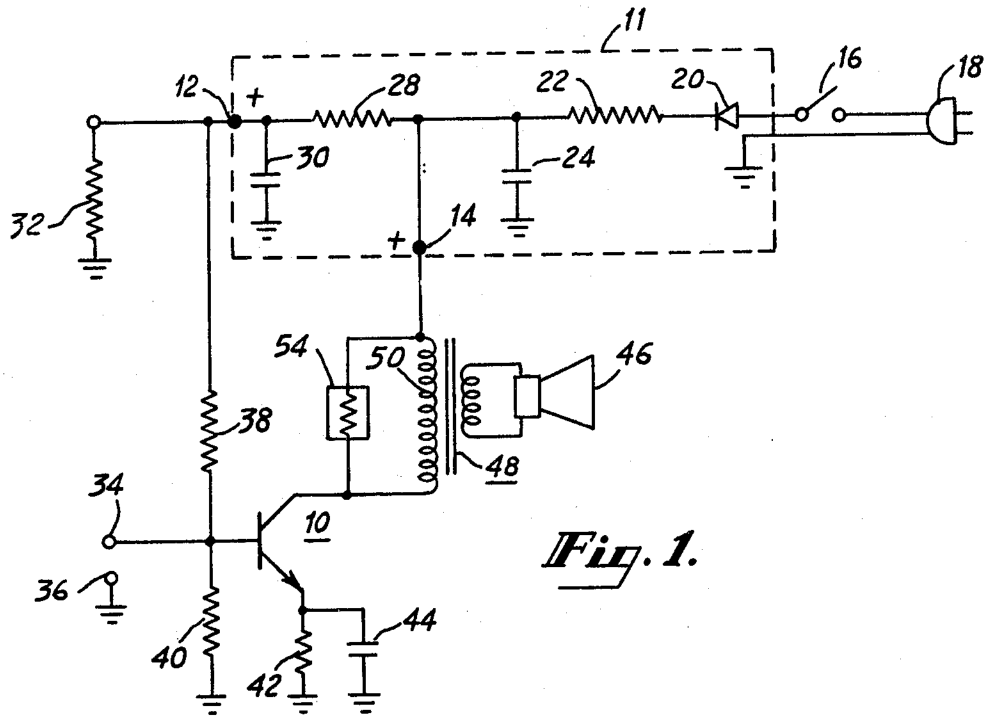
FIGURE 1 is a circuit diagram of an amplifying circuit embodying the invention.

An audio power amplifier stage for use in alternating current (AC) power-line operated electronic equipment (FIGURE 1) includes a high voltage NPN transistor 10 which is energized by a low voltage terminal 12 and a high voltage terminal 14 of a power supply 11 (shown within a dashed block). The power supply 11 is coupled through an on-off switch 16 to a plug 18 which is adapted to be connected to any wall socket.

When the switch 16 is closed, an AC power-line voltage is rectified by a rectifier 20 and filtered by a series resistor 22 and a shunt capacitor 24. The filter voltage that appears across the capacitor 24 comprises the high voltage output at the terminal 14, which in the present embodiment, is about 145 volts positive with respect to a common connection indicated by the conventional ground symbol. A further filtering netwowrk including a series resistor 28 and a shunt capacitor 30 provides the low voltage output at the terminal 12 which, in the present embodiment is about nine volts positive with respect to ground. The voltage at the terminal 12 may be used to energize the low level amplifier stages preceding the power amplifier. The low level stages are represented by an equivalent load resistor 32.

The input signals to be amplified are applied to the base of transistor 10 through a pair of input terminals 34 and 36. A pair of resistors 38 and 40 are connected between the low voltage terminal 12 of power supply 11 and ground providing the approprite base biasing potential. The emitter electrode of transistor 10 is connected to ground through a parallel biasing network including a resistor 42 and an audio bypass capacitor 44.

The amplifier is coupled to drive a loudspeaker 46 through an output transformer 48. The output transformer 48 includes a primary winding 50 connected between the collector electrode of the transistor 10 and the high voltage terminal 14 which provides the collector power supply voltage for energizing the transistor 10. Connected across the primary winding 50 is a voltage dependent (voltage sensitive) resistor (VDR) 54 providing the overvoltage protection for transistor 10.

The characteristics of the VDR element 54 (FIGURE 2) are selected so that over a normal range of signals the VDR element 54 presents a very high impedance and therefore can be disregarded for normal circuit operation. The protection afforded by the VDR element 54 will be fully explained at a later point in the specification.

With a sine wave type input signal applied to the input terminals 34 and 36, the maximum collector voltage swings that can be developed at the collector electrode to the transistor 10 approaches twice the value of the voltage at the high voltage terminal 14. As a result, the maximum value of the power supply voltage that is used to energize such an inductively loaded circuit is limited to no more than one half the maximum collector to base voltage rating of the transistor employed. Furthermore, an allowance is generally incorporated in the value of the power supply as a safety factor to allow for some protection against transients, line voltage variations, component variations etc.

If an input signal suddenly cuts off transistor 10 a high reactive voltage is induced in the primary winding 50 by the collapsing transformer field. The reactive voltage has a polarity that tends to keep the current flowing in the same direction as before cutoff and adds to the voltage at the high voltage terminal 14. The reactive voltage continues until the energy stored in the transformer 48 and the winding of speaker 46 is dissipated. Without some circuit protection this stored energy is dissipated by transistor 10. This reactive phenomenon is well-known and needs no further explanation here.

Without the protection of the VDR element 54, this high reactive voltage can exceed the value of the power supply voltage by several magnitudes depending upon many factors such as the rate of cut off, the inductance of the transformer, the coefficient of coupling, etc. The design problem of maintaining the collector voltage within the specified rating is even more difficult of solution if the transient input signal drives the transistor 10 into saturation and thereafter rapidly into cut off wherein a worse case condition occurs involving a maximum of stored transformer energy. Such transient inputs can be introduced into the receiver by radiation due to electrical storms or to fluorescent lighting. The same effect can also be accomplished by suddenly tuning the receiver to a strong signal from a local station wherein the output circuit is driven into saturation and then subsequently into cut off before the automatic volume control circuit can take control. In any case, whether the transistor was saturated or not before cut off, the magnitude of this reactive voltage in an inductively loaded high voltage transistor circuit may be sufficient to destory the transistor 10, or substantially degrade its operation.

Figure 2:
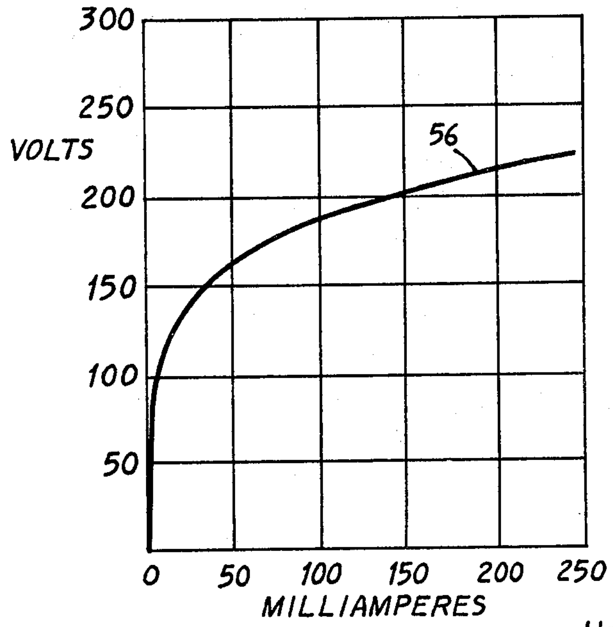
FIGURE 2 is a graphic representation of the voltage responsive device of FIGURE 1.

The non-linear voltage-current characteristic 56 of a XDR element 54 (shown in FIGURE 2) is approximated by the equation $I=KE^n$: where I and E are respectively the instantaneous current through the VDR element and the instantaneous voltage across the VDR element, K is a constant, the amperes flowing at 1 volt in the usual units and the exponent $n$ is dependent upon the composition and dimensions of the VDR element. A voltage dependent resistor exhibits little or no change in resistance or in characteristic with time and has substantially instantaneous response to short duration pulses. The characteristic of the VDR element 54 is selected so that the component represents a very high impedance to signal voltages, but rapidly represents a low impedance to voltages across transformer winding 50 that are higher than the safe operating level of the transistor 10. As a result, the VDR element 54 minimizes the harmful effects of these reactive transients by a damping effect that severely loads the primary winding 50 providing a current path that bypasses transistor 10 and dissipates transformer energy, but does not degrade the overall amplifier performance. A VDR element such as the Ferroxcube No. E299DD–P340 or equivalent, having its characteristics as shown in FIGURE 2, can be used in the circuit of FIGURE 1 when operating a TA2301 transistor, available from the Radio Corporation of America, from a 95 volt power supply (output 14) with a 3,000 ohm load. The VDR element 54 selected presents an approximately 25,000 ohms load across the transformer (in the absence of signal or for low voltage signals) which when compared to the 3,000 ohm circuit load can be neglected for signal voltages. Such a circuit operates safely to produce 1 watt of output power with low distortion. The protection circuit described above permits the output stage to operate safely with a considerable higher voltage power supply wherein an increase in gain and power output can be realized by making use of the percentage of power supply voltage previously set aside as a design safety factor. The circuit can also be operated with or without a load connected, whether or not the dynamic effect of the load reduces the transformer voltage swing, since the VDR element 54 also dampens any overvoltage that may occur as a result of a disconnected load.

What is claimed is:

1. A Class A audio amplifier comprising:

a transistor having base, emitter and collector electrodes;

means providing an input circuit coupled between said base and emitter electrodes for supplying input signals to be amplified;

an output circuit including a transformer having a primary winding for providing amplified output signals corresponding to said supplied signals;

means including an operating potential supply source connecting said primary winding between said emitter and collector electrodes, and a voltage responsive device exhibiting an impedance that is an inverse function of the voltage developed across it, connected across said transformer primary for dissipating the reactive voltage induced in said primary winding when a supplied input signal suddenly renders said transistor non-conductive.

2. A Class A audio amplifier comprising:

a transistor having base, collector and emitter electrodes;

input circuit means connected between said base and emitter electrodes for supplying input signals to be amplified;

output circuit means connected between said collector and emitter electrodes, said output circuit means including an inductive component and being adapted to be energized by a source of energizing potential for providing amplified output signals corresponding to said supplied signals, and a voltage sensitive device connected across said inductive component exhibiting a high impedance to a range of voltages below twice the value of said source of energizing potential and a substantially lower impedance to voltages above twice the value of said source of energizing potential, for dissipating the reactive voltage induced in said inductive component when a supplied input signal suddenly renders said transistor non-conductive.

3. A Class A audio amplifier comprising:

a transistor having a base, collector and emitter electrodes;

input circuit means connected between said base and emitter electrodes for supplying input signals to be amplified;

output circuit means including a transformer having a primary winding connected between said collector and emitter electrodes, said output circuit means being adapted to be energized by a source of energizing potential for providing amplified signals corresponding to said supplied signals;

a voltage sensitive resistor and circuit means coupling said voltage sensitive resistor to said primary winding so that said voltage sensitive resistor presents a substantially high impedance to signal voltages developed across said primary winding and a low impedance to voltages developed across said primary winding in response to supplied input signals which cause sudden voltage excursions at said collector electrode in excess of a predetermined voltage level.

4. A Class A audio amplifier comprising:

a semiconductor conductive device having a plurality of electrodes;

a source of constant direct current potential;

an inductive load connected in a current path including at least a pair of said electrodes and said source of constant direct current potential;

means for applying an input signal to said conductive device;

means for coupling an output signal from said inductive load; and a voltage sensitive device connected across said inductive load to provide a stored energy dissipation impedance for bypassing said conductive device when an applied input signal suddently renders said device non-conductive, the impedance of said voltage sensitive device being an inverse exponential function of the voltage developed across said voltage sensitive device.

5. A Class A audio amplifier as defined in claim 3 wherein said predetermined voltage level substantially corresponds to the breakdown voltage exhibited by said transistor.

6. A Class A audio amplifier as defined in claim 3 wherein said output circuit means is adapted to be energized by a source of operating potential having a value substantially equal to one-half the breakdown voltage exhibited by said transistor.

References Cited

UNITED STATES PATENTS

| | | | |
|---|---|---|---|
| 2,369,015 | 2/1945 | Camilli | 338—20 |

FOREIGN PATENTS

| | | |
|---|---|---|
| 932,095 | 7/1963 | Great Britain. |

ROY LAKE, *Primary Examiner.*

L. J. DAHL, *Assistant Examiner.*